(12) United States Patent
Mitsui et al.

(10) Patent No.: US 12,081,115 B2
(45) Date of Patent: Sep. 3, 2024

(54) SEMICONDUCTOR DRIVE DEVICE, SEMICONDUCTOR DEVICE, AND POWER CONVERSION DEVICE

(71) Applicant: Mitsubishi Electric Corporation, Tokyo (JP)

(72) Inventors: Yohei Mitsui, Tokyo (JP); Yasutaka Imamura, Tokyo (JP); Junichi Nakashima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 220 days.

(21) Appl. No.: 17/796,269

(22) PCT Filed: Mar. 24, 2020

(86) PCT No.: PCT/JP2020/013023
§ 371 (c)(1),
(2) Date: Jul. 29, 2022

(87) PCT Pub. No.: WO2021/192035
PCT Pub. Date: Sep. 30, 2021

(65) Prior Publication Data
US 2023/0122671 A1 Apr. 20, 2023

(51) Int. Cl.
*H02M 1/32* (2007.01)
*G01K 7/24* (2006.01)
(Continued)

(52) U.S. Cl.
CPC ........... *H02M 1/327* (2021.05); *G01K 7/245* (2013.01); *H02H 5/04* (2013.01); *H03K 2017/0806* (2013.01)

(58) Field of Classification Search
CPC .......... H02M 1/327; G01K 7/245; H02H 5/04; H03K 2017/0806
See application file for complete search history.

(56) References Cited

U.S. PATENT DOCUMENTS

2005/0178372 A1* 8/2005 Kesler .................... F02P 3/055
374/E7.035
2008/0099836 A1* 5/2008 Matsuura ............ H01L 27/0629
257/334

(Continued)

FOREIGN PATENT DOCUMENTS

JP 2018-7373 A 1/2018

OTHER PUBLICATIONS

International Search Report and Written Opinion mailed on Jul. 7, 2020, received for PCT Application PCT/JP2020/013023, filed on Mar. 24, 2020, 9 pages including English Translation.

*Primary Examiner* — Scott Bauer
(74) *Attorney, Agent, or Firm* — XSENSUS LLP

(57) ABSTRACT

A semiconductor drive device includes a drive circuit that drives a semiconductor switching element, a passive element connected to a gate of the semiconductor switching element to prevent a gate current of the semiconductor switching element, a switching element connected in series to the passive element, a control circuit that controls the switching element, and a temperature detection circuit that detects a temperature of the semiconductor switching element. The control circuit controls the switching element such that when the temperature detected by the temperature detection circuit is high, the gate current is prevented more than when the temperature is low.

20 Claims, 12 Drawing Sheets

(51) Int. Cl.
  *H02H 5/04*    (2006.01)
  *H03K 17/08*   (2006.01)

(56) References Cited

U.S. PATENT DOCUMENTS

| 2015/0358013 | A1* | 12/2015 | Sakai | H03K 17/14 327/109 |
|---|---|---|---|---|
| 2022/0311431 | A1* | 9/2022 | Nakashima | H03K 17/122 |
| 2023/0059002 | A1* | 2/2023 | Suzuki | H03K 17/14 |

* cited by examiner

SEMICONDUCTOR DRIVE DEVICE, SEMICONDUCTOR DEVICE, AND POWER CONVERSION DEVICE

CROSS-REFERENCE TO RELATED APPLICATION

The present application is based on PCT filing PCT/JP2020/013023, filed Mar. 24, 2020, the entire contents of which are incorporated herein by reference.

TECHNICAL FIELD

The present disclosure relates to a semiconductor drive device, a semiconductor device, and a power conversion device.

BACKGROUND ART

In a power semiconductor module used in a power conversion device such as an inverter or a converter, when a semiconductor switching element performs a switching operation, sometimes unintended vibration is generated in a gate voltage at the semiconductor switching element. For example, in switching in an inductive load, sometimes a large amplitude vibration is observed in voltage at a gate and a source of the semiconductor switching element at turn-on and turn-off. In addition, even when an arm short circuit is generated in the power semiconductor module, the above-described vibration is sometimes generated.

This vibration phenomenon is caused by parasitic capacitance of the semiconductor switching element and parasitic inductance of wiring connected to the semiconductor switching element due to steep fluctuation of a drain current and a drain voltage by the switching of the semiconductor switching element, and is referred to as "gate oscillation". The gate oscillation, damages an oxide film of the semiconductor switching element, causes degradation of the semiconductor switching element, and causes various noises such as a radiation noise and a propagation noise.

In order to suppress such the gate oscillation, generally, a capacitor is disposed between the gate and the source of the semiconductor switching element (see, for example, PTL 1), or a gate resistance is increased. A low pass filter is formed by disposing the capacitor between the gate and the source, and the gate oscillation is prevented by preventing a high frequency current flowing into the gate. In addition, by increasing the gate resistance, the gate current is prevented, and the gate oscillation is prevented.

CITATION LIST

Patent Literature

PTL 1: Japanese Patent Laying-Open No. 2018-7373

SUMMARY OF INVENTION

Technical Problem

However, when the capacitor (capacitance) is disposed between the gate and the source or the gate resistance is increased, switching speed of the semiconductor switching element is reduced, so that there is contradiction that the switching loss increases although the gate oscillation can be prevented.

Therefore, an object of the present disclosure is to provide a semiconductor drive device, a semiconductor device, and a power conversion device including the semiconductor drive device and the semiconductor device capable of achieving both prevention of the gate oscillation and prevention of the switching loss of the semiconductor switching element.

Solution to Problem

A semiconductor drive device of the present disclosure includes a drive circuit to drive a semiconductor switching element, a passive element connected to a gate of the semiconductor switching element to prevent a gate current of the semiconductor switching element, a switching element connected in series to the passive element, a control circuit to control the switching element, and a temperature detection circuit to detect a temperature of the semiconductor switching element. The control circuit controls the switching element such that when the temperature detected by the temperature detection circuit is high, the gate current is prevented more than when the temperature is low.

According to this semiconductor drive device, the gate oscillation generated in the semiconductor switching element can be prevented by providing the above-described passive element. At this point, in the semiconductor switching element, as the temperature increases, a turn-on speed tends to increase because a gate threshold voltage decreases, and the gate oscillation is easy to generate. On the other hand, the gate oscillation is hardly generated at the low temperature, and thus, there is a large adverse effect of an increase in switching loss due to a function of the passive element. Accordingly, in the semiconductor drive device of the present disclosure, when the temperature of the semiconductor switching element is high, the gate current is prevented by controlling the switching element connected in series to the passive element, and the gate oscillation is prevented. On the other hand, when the temperature is low, the function of the passive element that prevents the gate current is prevented, and the increase in the switching loss is prevented.

Advantageous Effects of Invention

Consequently, according to the semiconductor drive device, the semiconductor device, and the power conversion device of the present disclosure, both the prevention of the gate oscillation of the semiconductor switching element and the prevention of the switching loss can be achieved.

DESCRIPTION OF EMBODIMENTS

Figure 1:
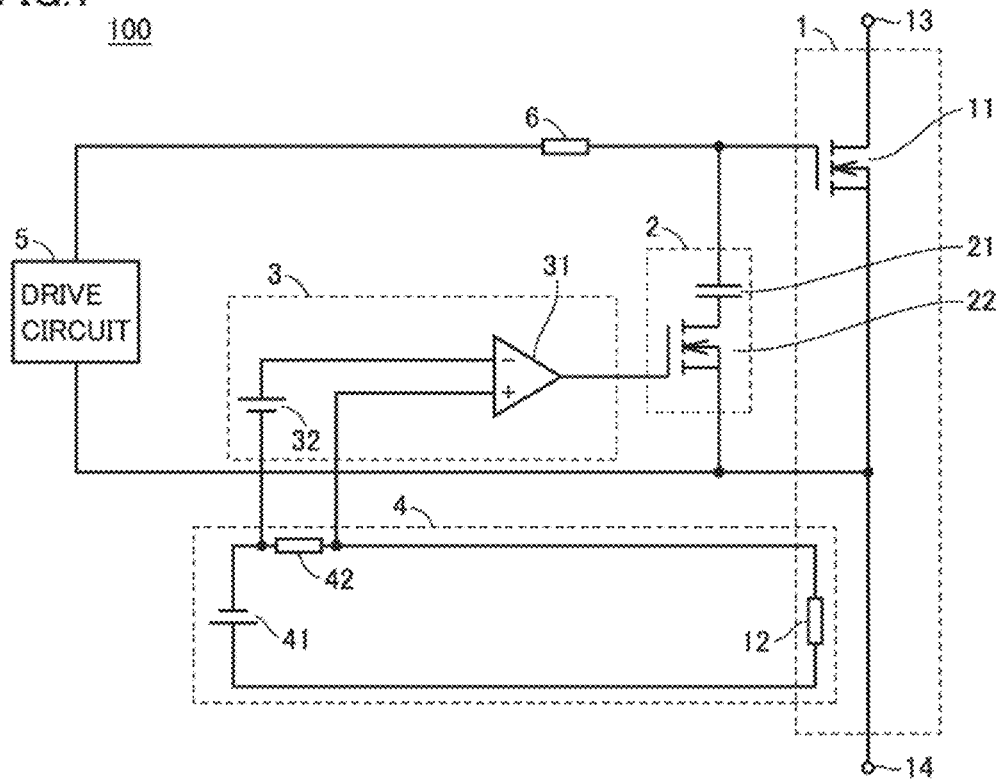
FIG. 1 is a circuit diagram illustrating a configuration of a semiconductor drive device according to a first embodiment.

With reference to the drawings, embodiments of the present disclosure will be described in detail below. Although a plurality of embodiments will be described below, it is planned from the beginning of the application that the configurations of the embodiments are appropriately combined. In the drawings, the same or corresponding portion is denoted by the same reference numeral, and the description thereof will not be repeated.

First Embodiment

FIG. 1 is a circuit diagram illustrating, a configuration of a semiconductor drive device according to a first embodiment of the present disclosure. With reference to FIG. 1, a semiconductor drive device 100 drives a power semiconductor module 1, and includes a capacitance switching circuit 2, a control circuit 3, a temperature detection circuit 4, a drive circuit 5, and a gate resistor 6.

Power semiconductor module 1 includes a semiconductor switching element 11 and a thermistor 12 (described later) of temperature detection circuit 4. Semiconductor switching element 11 is an NPN-type metal oxide semiconductor field effect transistor (MOSFET), and a drain electrode, a source electrode, and a gate electrode of semiconductor switching element 11 are connected to a drain terminal 13, a source terminal 14, and gate resistor 6, respectively.

Semiconductor switching element 11 is configured of a wide band gap semiconductor. For example, the wide bandgap semiconductor is silicon carbide (SiC), gallium nitride (GaN), or diamond (C). The wide hand gap semiconductor has excellent voltage resistance as compared with a conventional silicon semiconductor, and the same voltage can be controlled with a thickness of half or less as compared with a conventional silicon-based element by configuring semiconductor switching element 11 with the wide band gap semiconductor.

Capacitance switching circuit 2 includes a capacitor 21 and a switching element 22. Switching element 22 is connected in series to capacitor 21, and a circuit including capacitor 21 and switching element 22 connected in series is electrically connected between the gate and the source of semiconductor switching element 11.

Capacitor 21 is a passive element that prevents current flowing into the gate of semiconductor switching element 11. An LC filter (low-pass filter) is formed by capacitance of capacitor 21 and wiring inductance, and gate oscillation can be prevented by inhabiting a high-frequency current flowing into the gate of semiconductor switching element 11.

Switching element 22 is an NPN MOSFET and is driven by control circuit 3. When switching element 22 is turned on, capacitor 21 is electrically connected between the gate and the source of semiconductor switching element 11, and capacitor 21 functions as a filter. On the other hand, when switching element 22 is turned off, capacitor 21 is electrically disconnected from between the gate and the source of semiconductor switching element 11, and capacitor 21 does not function. Switching element 22 may be a bipolar transistor.

Control circuit 3 includes a comparator 31 and a reference voltage source 32. A positive input terminal of comparator 31 is connected to one end of a voltage dividing resistor 42 (described later) of temperature detection circuit 4, and a negative input terminal of comparator 31 is connected to a positive electrode of reference voltage source 32. A negative electrode of reference voltage source 32 is connected to the other end of voltage dividing resistor 42 of temperature detection circuit 4. An output terminal of comparator 31 is connected to a gate electrode of switching element 22 of capacitance switching circuit 2.

Reference voltage source 32 outputs a constant reference voltage. Control circuit 3 constitutes a signal amplifier circuit that outputs a comparison result between the voltage across voltage dividing resistor 42 and the reference voltage at reference voltage source 32. When the voltage across voltage dividing resistor 42 is lower than the reference voltage at reference voltage source 32, the output of comparator 31 is deactivated (logic low), and switching element 22 is turned off. On the other hand, when the voltage across voltage dividing resistor 42 exceeds the reference voltage at reference voltage source 32, the output of comparator 31 is activated (logic high), and switching element 22 is turned on.

Temperature detection circuit 4 includes a voltage source 41, voltage dividing resistor 42, and thermistor 12. Thermistor 12 is provided in power semiconductor module 1, and disposed near semiconductor switching element 11 so as to be able to detect the temperature of semiconductor switching element 11. In the first embodiment, thermistor 12 is a negative temperature coefficient (NTC) thermistor in which a resistance value decreases as the temperature increases.

Voltage source 41 outputs a constant voltage. Voltage dividing resistor 42 is connected between the negative electrode of voltage source 41 and thermistor 12. The other end of thermistor 12 is connected to the positive electrode of voltage source 41. That is, a constant voltage is applied from voltage source 41 to thermistor 12 and voltage dividing resistor 42 connected in series. The positive input terminal of comparator 31 of control circuit 3 is connected onto the side of thermistor 12 of voltage dividing resistor 42, and the negative electrode of reference voltage source 32 of control circuit 3 is connected onto the side of voltage source 41 of voltage dividing resistor 42.

Drive circuit 5 is a circuit that drives semiconductor switching element 11 of power semiconductor module 1, and for example, switches the gate voltage at semiconductor switching element 11 by a push-pull circuit. Gate resistor 6 is connected between drive circuit 5 and the gate of semiconductor switching element 11.

In semiconductor drive device 100, whether to cause capacitor 21 of capacitance switching circuit 2 to function is switched according to the temperature detection result by thermistor 12. Qualitatively, when the temperature of semiconductor switching element 11 is high, the resistance value of thermistor 12 decreases, so that the voltage across voltage dividing resistor 42 increases. Then, when the voltage across voltage dividing resistor 42 exceeds the reference voltage at reference voltage source 32, the output of comparator 31 is activated. Then, switching element 22 of capacitance switching circuit 2 is turned on, and capacitor 21 is electrically connected between the gate and the source of semiconductor switching element 11 to function as a filter. This makes it possible to prevent the gate oscillation that is easily generated at high temperatures.

On the other hand, when the temperature of semiconductor switching element 11 is low, the resistance value of thermistor 12 increases, so that the voltage across voltage dividing resistor 42 decreases. Then, when the voltage across voltage dividing resistor 42 is lower than the reference voltage at reference voltage source 32, the output of comparator 31 becomes inactive. Then, switching element 22 of capacitance switching circuit 2 is turned off, capacitor 21 is electrically disconnected from between the gate and the source of semiconductor switching element 11, and capacitor 21 does not function as a filter. Thus, a decrease in a switching speed of semiconductor switching element 11 can be prevented at a low temperature at which the gate oscillation is hardly generated, and a switching loss can be prevented.

Figure 2:
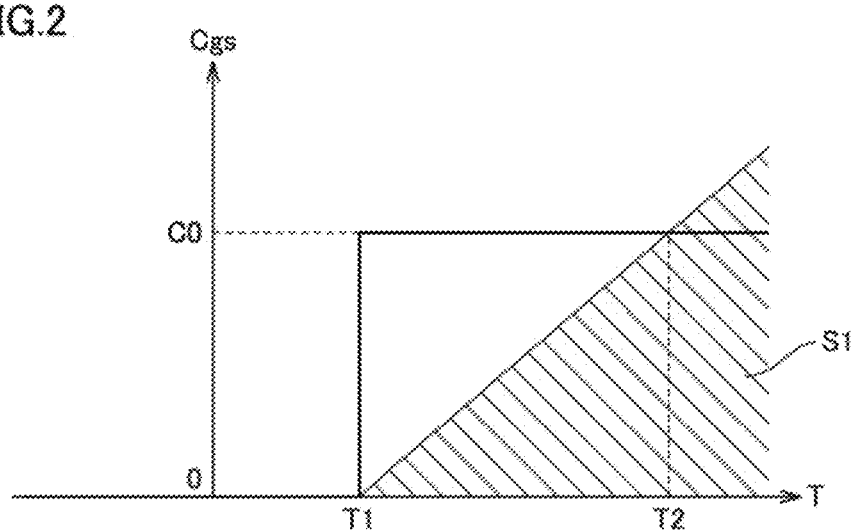
FIG. 2 is a view illustrating an example of a relationship between a temperature of a semiconductor switching element and capacitance between a gate and a source of the semiconductor switching element.

FIG. 2 is a view illustrating an example of a relationship between a temperature T of semiconductor switching element 11 and capacitance Cgs between the gate and the source of semiconductor switching element 11. With reference to FIG. 2, a region S1 is a region where the gate oscillation is generated. Such the region can be previously grasped by experiment, simulation, or the like when the gate is turned on, when the gate is turned off, or when an arm short circuit occurs, in which the gate oscillation is generated.

From FIG. 2, it can be understood that when the gate source capacitance value Cgs is zero, the gate oscillation is generated when temperature T of semiconductor switching element 11 exceeds T1, and a larger capacitance is required to prevent the gate oscillation as the temperature becomes higher.

Therefore, in the first embodiment, the reference voltage at reference voltage source 32 is set such that switching element 11 of capacitance switching circuit 2 is switched on and off at temperature T1 at which the gate oscillation of semiconductor switching element 22 is generated when the gate-source capacitance value Cgs is zero. Specifically, the reference voltage at reference voltage source 32 is set to the voltage across voltage dividing resistor 42 when temperature of semiconductor switching element 11 is T1. Thus, when temperature T is less than or equal to set temperature T1, switching element 22 is turned off, and when temperature exceeds set temperature T1, switching element 22 is turned on.

The capacitance value of capacitor 21 is set based on an operation guarantee temperature T2 of semiconductor switching element 11. Specifically, the capacitance value of capacitor 21 is set to an upper limit capacitance value C0 of region S1 where the gate oscillation is generated when temperature T of semiconductor switching element 11 is operation guarantee temperature T2. Accordingly, when temperature is less than or equal to operation guarantee temperature 12, the gate oscillation can be prevented.

With the above setting, when temperature of semiconductor switching element 11 detected by temperature detection circuit 4 is less than or equal to set temperature T1, the capacitance between the gate and the source of semiconductor switching element 11 can be inhibited to prevent the switching loss. On the other hand, when temperature T is higher than set temperature T1, capacitor 21 can prevent the gate oscillation within a range not exceeding operation guarantee temperature T2.

Furthermore, according to semiconductor drive device 100, switching element 22 of capacitance switching circuit 2 is controlled by control circuit 3 based on the detection result of temperature detection circuit 4, so that the on and off timing of switching element 22 can be easily adjusted by adjusting the reference voltage at reference voltage source 32 and voltage dividing resistor 42 regardless of a characteristic of thermistor 12.

First Modification

A PNP-type MOSFET or a bipolar transistor may be used as the switching, element of the capacitance switching circuit.

Figure 3:
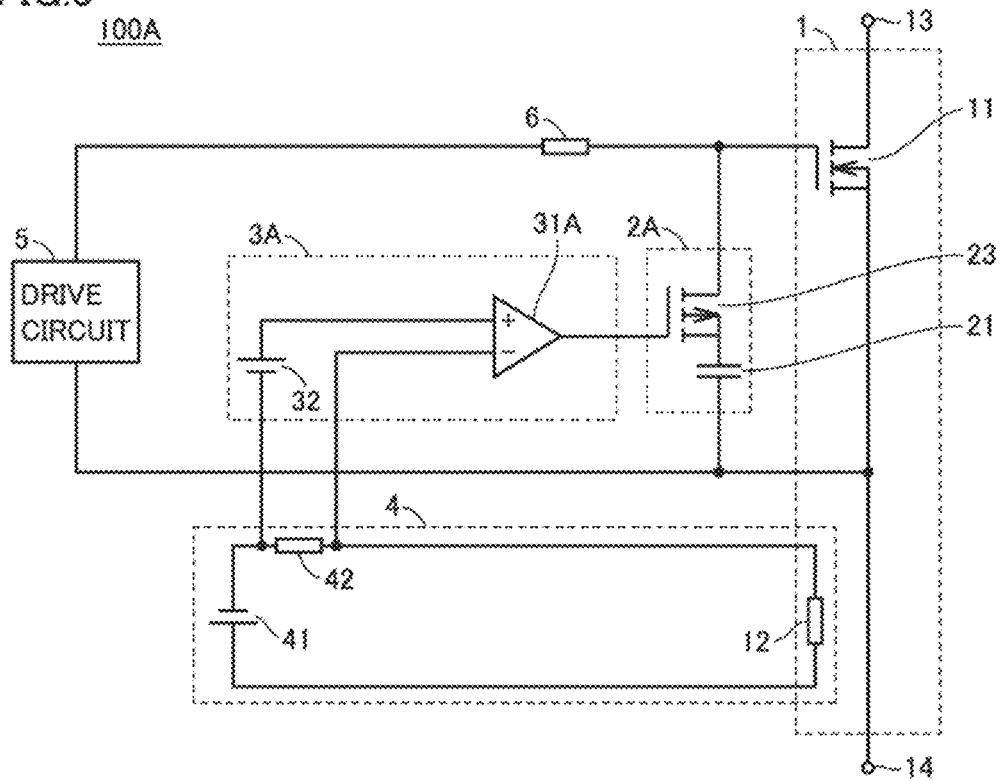
FIG. 3 is a circuit diagram illustrating a configuration of a semiconductor drive device according to a first modification.

FIG. 3 is a circuit diagram illustrating a configuration of a semiconductor drive device according to a first modification. With reference to FIG. 3, in the configuration of semiconductor drive device 100 in FIG. 1, a semiconductor drive device 100A includes a capacitance switching circuit 2A and a control circuit 3A instead of capacitance switching circuit 2 and control circuit 3.

Capacitance switching circuit 2A includes capacitor 21 and a switching element 23. Switching element 23 is the PNP-type MOSFET, and is connected in series to capacitor 21 between the gate of semiconductor switching element 11 and capacitor 21. Switching element 23 is driven by control circuit 3A. Switching element 23 may also be a bipolar transistor.

Control circuit 3A includes a comparator 31A and reference voltage source 32. The positive input terminal of comparator 31A is connected to the positive electrode of reference voltage source 32, and the negative input terminal of comparator 31A is connected to one end of voltage dividing resistor 42 of temperature detection circuit 4.

Other configurations of semiconductor drive device 100A are the same as those of semiconductor drive device 100 in FIG. 1.

With such the configuration, when temperature T of semiconductor switching element 11 is less than or equal to set temperature T1 (FIG. 2), the voltage across voltage dividing resistor 42 becomes less than or equal to the reference voltage at reference voltage source 32, and the output of comparator 31A is activated (logic high). Thus, switching element 23 of capacitance switching circuit 2A is turned off, and capacitor 21 is electrically disconnected from between the gate and the source of semiconductor switching element 11. Accordingly, capacitor 21 does not function, and the increase in the switching loss can be prevented due to the decrease in the switching speed of semiconductor switching element 11 at a low temperature at which the gate oscillation is hardly generated.

On the other hand, when temperature T is higher than set temperature T1, the voltage across voltage dividing resistor 42 becomes higher than the reference voltage at reference voltage source 32, and the output of comparator 31A is deactivated (logic low). Thus, switching element 23 is turned on, and capacitor 21 is electrically connected between the gate and the source of semiconductor switching element 11 to function as a filter. Consequently, the gate oscillation that is easily generated at high temperatures can be prevented.

Second Modification

A positive temperature coefficient (PTC) thermistor may be used as the thermistor for detecting the temperature of power semiconductor module 1.

Figure 4:
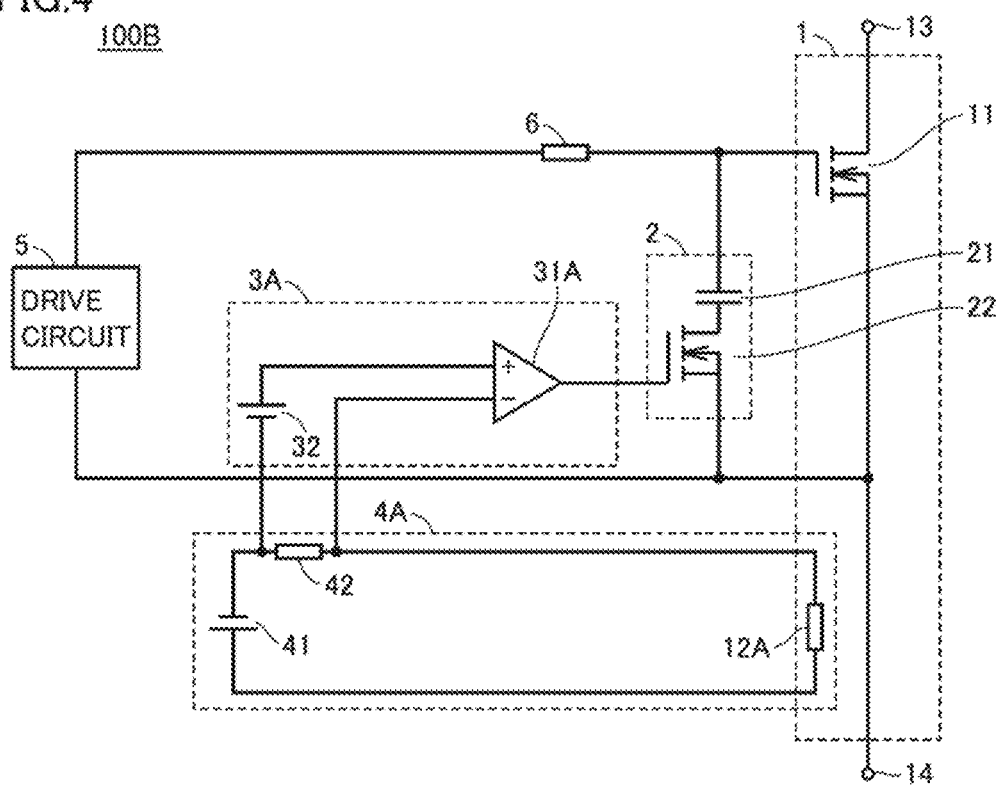
FIG. 4 is a circuit diagram illustrating a configuration of a semiconductor drive device according to a second modification.

FIG. 4 is a circuit diagram illustrating a configuration of a semiconductor drive device according to a second modification. With reference to FIG. 4, in the configuration of semiconductor drive device 100 in FIG. 1, a semiconductor drive device 100B includes control circuit 3A and a temperature detection circuit 4A instead of control circuit 3 and temperature detection circuit 4. Control circuit 3A is as described in FIG. 3 in the first modification.

Temperature detection circuit 4A includes a thermistor 12A instead of thermistor 12 in the configuration of temperature detection circuit 4 in FIG. 1. Thermistor 12A is also provided in power semiconductor module 1, and disposed near semiconductor switching element 11. Thermistor 12A is a PTC thermistor in which the resistance value also increases as the temperature increases.

Other configurations of semiconductor drive device 1008 are the same as those of semiconductor drive device 100 in FIG. 1.

In semiconductor drive device 100B, when temperature T of semiconductor switching element 11 is less than or equal to set temperature T1 (FIG. 2), the voltage across voltage dividing resistor 42 is greater than or equal to the reference voltage of reference voltage source 32, and the output of comparator 31A is deactivated (logic low). Thus, switching element 22 of capacitance switching circuit 2 is turned off, and capacitor 21 does not function as a filter. Therefore, the increase in the switching loss can be prevented at a low temperature.

On the other hand, when temperature T of semiconductor switching element 11 is greater than set temperature T1, the voltage across voltage dividing resistor 42 becomes lower than the reference voltage of reference voltage source 32, and the output of comparator 31A is activated (logic high). Thus, switching element 22 is turned on, and capacitor 21 functions as a filter. Consequently, the gate oscillation that is easily generated at high temperatures can be prevented.

Second Embodiment

Figure 5:
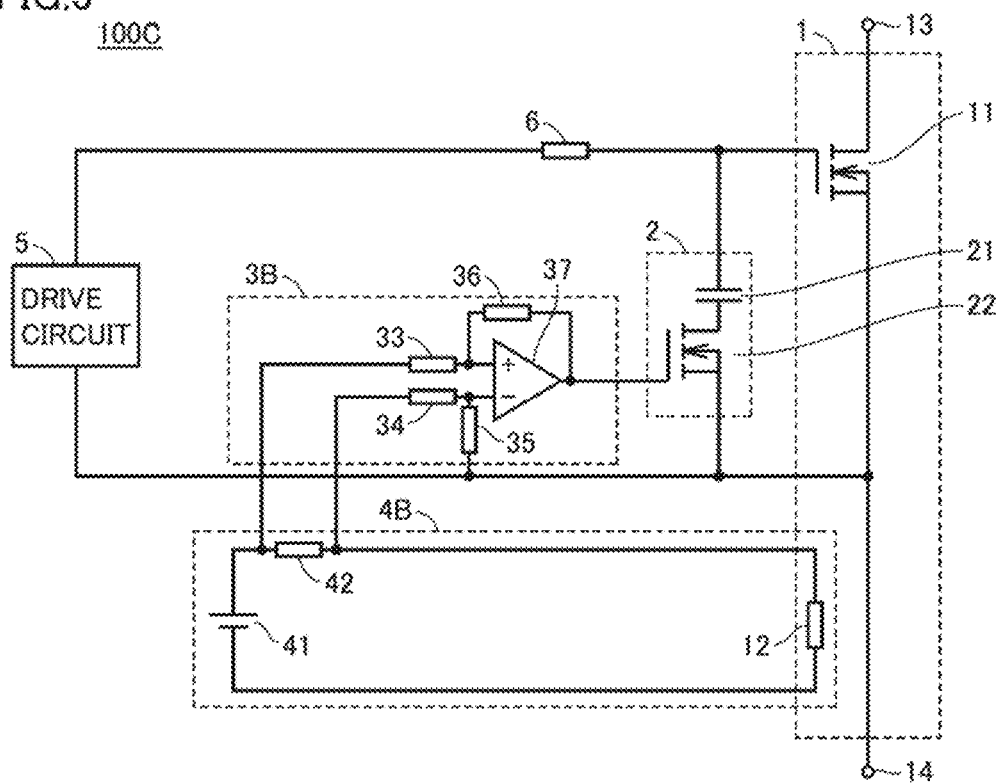
FIG. 5 is a circuit diagram illustrating a configuration of a semiconductor drive device according to a second embodiment.

FIG. 5 is a circuit diagram illustrating a configuration of a semiconductor drive device according to a second embodiment. With reference to FIG. 5, in the configuration of semiconductor drive device 100 in FIG. 1, a semiconductor drive device 100C includes a control circuit 3B and a temperature detection circuit 4B instead of control circuit 3 and temperature detection circuit 4.

Control circuit 3B includes an operational amplifier 37 and resistance elements 33 to 36. The positive input terminal of operational amplifier 37 is connected to one end of voltage dividing resistor 42 of temperature detection circuit 4B through resistance element 33. A negative input terminal of operational amplifier 37 is connected to the other end of voltage dividing resistor 42 through resistance element 34. Resistance element 35 is connected between the negative input terminal of operational amplifier 37 and the source of semiconductor switching element 11, and resistance element 36 is connected between the output ref urinal and the positive input terminal of operational amplifier 37. The output terminal of operational amplifier 37 is connected to the gate of switching element 22 of capacitance switching circuit 2.

Operational amplifier 37 and resistance element 33 to 36 form a differential amplifier circuit that outputs a signal corresponding to the voltage across voltage dividing resistor 42 to the gate of switching element 11. As the voltage across voltage dividing resistor 42 increases, the positive and negative voltage difference between the input terminals of operational amplifier 37 increases, and the output of operational amplifier 37 increases.

Temperature detection circuit 4B is obtained by reversing the polarity of voltage source 41 in the configuration of temperature detection circuit 4 in FIG. 1. That is, the positive electrode of voltage source 41 is connected to voltage dividing resistor 42, and the negative electrode of voltage source 41 is connected to thermistor 12.

Other configurations of semiconductor drive device 100C are the same as those of semiconductor drive device 100 in FIG. 1.

In semiconductor drive device 100C, switching element 22 of capacitance switching circuit 2 operates as a variable resistor according to the temperature detection result by thermistor 12. Specifically, as the temperature of semiconductor switching element 11 increases, the resistance value of thermistor 12 decreases, and the voltage across voltage dividing resistor 42 increases. Then, the output of operational amplifier 37 increases, and the resistance value of switching element 22 decreases. Accordingly, the current flowing into capacitor 21 increases, and the gate oscillation prevention function by capacitor 21 is enhanced.

On the other hand, as the temperature of semiconductor switching element 11 decreases, the resistance value of thermistor 12 increases, and the voltage across voltage dividing resistor 42 decreases. Then, the output of operational amplifier 37 decreases, and the resistance value of switching element 22 increases, so that the current flowing into capacitor 21 is prevented. Consequently, at a low temperature at which the gate oscillation is hardly generated, an increase in switching loss due to the decrease in the switching speed of semiconductor switching element 11 can be prevented.

In semiconductor drive device 100 of the first embodiment, as illustrated in FIG. 2, when temperature T of semiconductor switching element 11 exceeds set temperature T1, switching element 22 is turned on according to the output of comparator 31, so that it can be said that the capacitance preventing the gate oscillation is excessive particularly at temperature T slightly higher than set temperature T1. In semiconductor drive device 100C of the second embodiment, since the resistance value of switching element 22 continuously changes according to temperature T of semiconductor switching element 11, so that appropriate capacitance can be connected between the gate and the source of semiconductor switching element 11 according to temperature T. Consequently, the decrease in the switching speed of semiconductor switching element 11 can be prevented, and the switching loss can be prevented, Also in semiconductor drive device 100C, switching element 22 of capacitance switching circuit 2 is controlled by control circuit 3B based on the detection result of temperature detection circuit 4B, so that the resistance value of switching element 22 can be easily adjusted by adjusting control circuit 3B and voltage dividing resistor 42 regardless of the characteristic of thermistor 12.

Although not particularly illustrated, also in the second embodiment, the PNP-type MOSFET or a bipolar transistor may be used as the switching element of capacitance switching circuit 2 as in the first modification. As in the second modification, a PTC thermistor may be used as a thermistor detecting temperature T of power semiconductor module 1.

Third Embodiment

In a third embodiment, a resistance element is used as a passive element that prevents the current flowing into the gate of semiconductor switching element 11.

Figure 6:
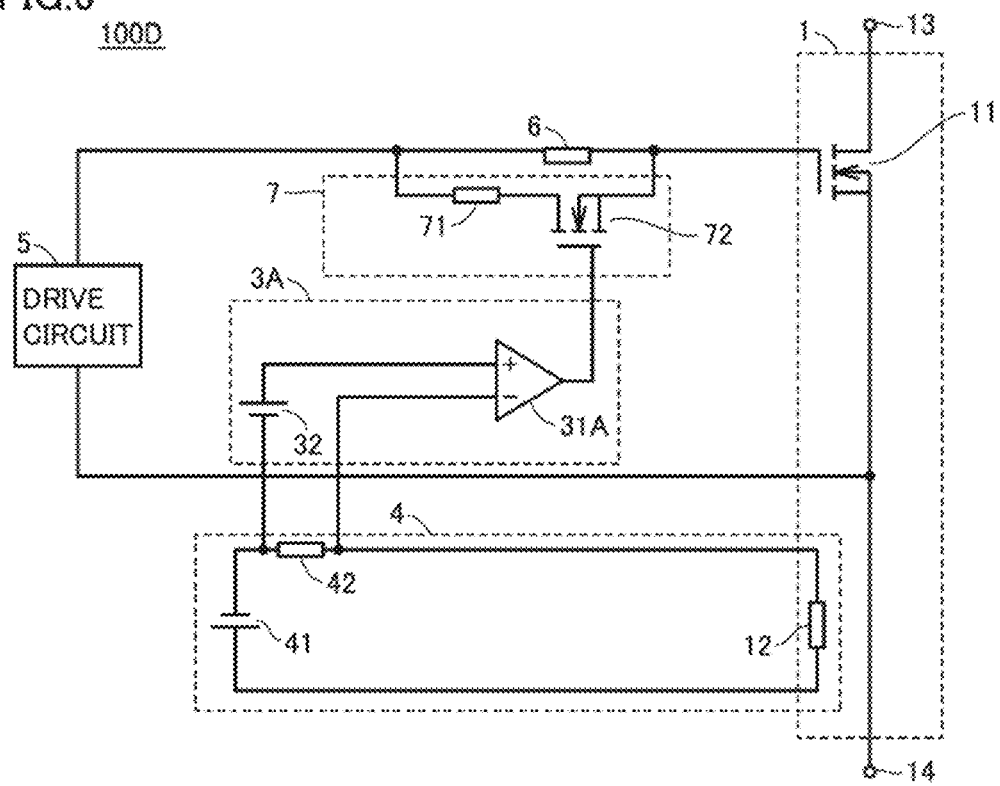
FIG. 6 is a circuit diagram illustrating a configuration of a semiconductor drive device according to a third embodiment.

FIG. 6 is a circuit diagram illustrating a configuration of a semiconductor drive device according to a third embodiment. With reference to FIG. 6, in the configuration of semiconductor drive device 100 in FIG. 1, a semiconductor drive device 100D includes a resistance switching circuit 7 and control circuit 3A instead of capacitance switching circuit 2 and control circuit 3. Control circuit 3A is as described in FIG. 3 in the first modification.

Resistance switching circuit 7 includes a resistance element 71 and a switching element 72. Switching element 72 is connected in series to resistance element 71, and a circuit including resistance element 71 and switching element 72 connected in series is connected in parallel to gate resistor 6.

Resistance element 71 is a passive element that prevents the current flowing into the gate of semiconductor switching element 11. When switching element 72 connected in series to resistance element 71 is switched from on to off, the resistance value of the circuit formed by gate resistor 6 and resistance element 71 increases, so that the current flowing into the gate of semiconductor switching element 11 can be prevented.

Other configurations of semiconductor drive device 100D are the same as those of semiconductor drive device 100 in FIG. 1.

In semiconductor drive device 100D, whether to cause resistance element 71 of resistance switching circuit 7 to function is switched according to the temperature detection result by thermistor 12. Qualitatively, when the temperature of semiconductor switching element 11 is high, the resistance value of thermistor 12 decreases, so that the voltage across voltage dividing resistor 42 increases. When the voltage across voltage dividing resistor 42 exceeds the reference voltage at reference voltage source 32, the output of comparator 31A is deactivated. Then, switching element 72 of resistance switching circuit 7 is turned off, and resistance element 71 is electrically disconnected from the gate of semiconductor switching element 11. As a result, the gate resistance of semiconductor switching element 11 increases, and the gate oscillation that is easily generated at high temperatures is prevented.

On the other hand, when the temperature of semiconductor switching element 11 is low, the resistance value of thermistor 12 increases, so that the voltage across voltage dividing resistor 42 decreases. When the voltage across voltage dividing resistor 42 is lower than the reference voltage at reference voltage source 32, the output of comparator 31A is activated. Then, switching element 72 of resistance, switching circuit 7 is turned on and resistance element 71 is electrically connected to the gate of semiconductor switching element 11, so that the gate resistance of semiconductor switching element 11 decreases. Thus, a decrease in a switching speed of semiconductor switching element 11 can be prevented at a low temperature at which the gate oscillation is hardly generated, and a switching loss can be prevented.

Figure 7:
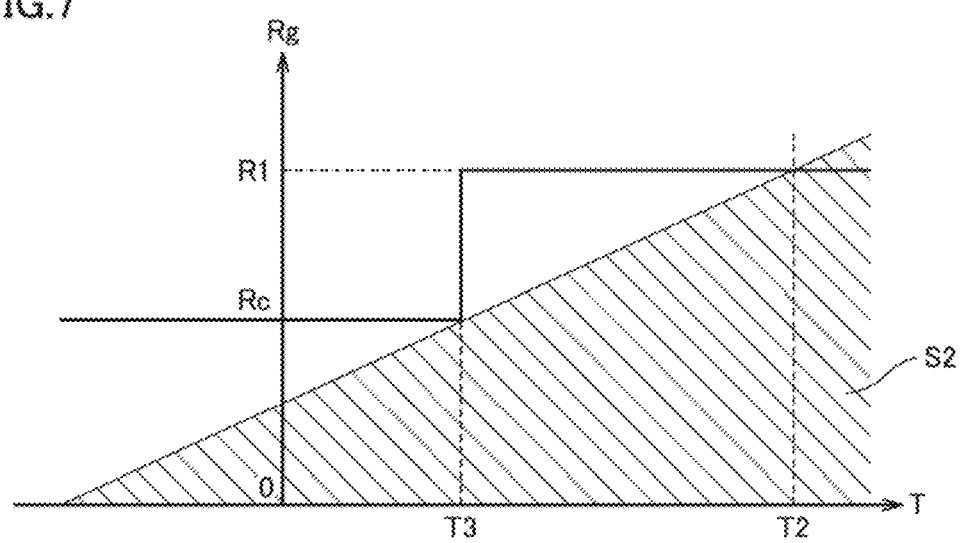
FIG. 7 is a view illustrating an example of a relationship between the temperature of the semiconductor switching element and a gate resistance value of the semiconductor switching element.

FIG. 7 is a view illustrating an example of a relationship between temperature T of semiconductor switching element 11 and a gate resistance value Rg of semiconductor switching element 11. With reference to FIG. 7, a region S2 is a region where the gate oscillation is generated. Such the region can be previously grasped by experiment, simulation, or the like when the gate is turned on, when the cote is turned off, or when an arm short circuit occurs, in which the gate oscillation is generated.

From FIG. 7, it can be understood that when gate resistance value Rg is a combined resistance value Re of gate resistor 6 and resistance element 71 in FIG. 6, the gate oscillation is generated when temperature T of semiconductor switching element 11 exceeds a temperature T3, and gate resistance value Rg is required to be increased in order to prevent the gate oscillation as the temperature becomes higher.

Accordingly, in the third embodiment, temperature T3 at which the gate oscillation of semiconductor switching element 11 is generated is set when gate resistance value Rg is combined resistance value Rc. Then, at set temperature T3, the reference voltage of reference voltage source 32 is set such that switching element 72 of resistance switching circuit 7 is switched on and off. Specifically, the reference voltage of reference voltage source 32 is set to the voltage across voltage dividing resistor 42 when temperature T of semiconductor switching element 11 is temperature T3. Thus, switching element 72 is turned on when temperature is less than or equal to set temperature 13, and switching element 72 is turned off when temperature T exceeds set temperature T3.

In the third embodiment, the resistance value of gate resistor 6 is set based on operation guarantee temperature T2 of semiconductor switching element 11. Specifically, the resistance value of gate resistor 6 is set to an upper limit resistance value R1 of region S2 where the gate oscillation is generated when temperature T of semiconductor switching element 11 is operation guarantee temperature 12. Accordingly, when temperature T is less than or equal to operation guarantee temperature T2, the gate oscillation can be prevented.

With the above setting, when temperature T of semiconductor switching element 11 detected by temperature detection circuit 4 is less than or equal to set temperature T3, the capacitance between the gate resistance of semiconductor switching element 11 can be inhibited to prevent the switching loss. On the other hand, when temperature is higher than set temperature T3, gate resistor 6 can suppress the gate oscillation within the range not exceeding operation guarantee temperature T2.

Also in the configuration of semiconductor drive device 100D, switching element 72 of resistance switching circuit 7 is controlled by control circuit 3A based on the detection result of temperature detection circuit 4, so that the on and off timing of switching element 72 can be easily adjusted by adjusting the reference voltage of reference voltage source 32 and voltage dividing resistor 42 regardless of the characteristic of thermistor 12.

Although not particularly illustrated, also in the third embodiment, the PNP type MOSFET or a bipolar transistor may be used for the switching element of resistance switching circuit 7. In addition, a PTC thermistor may be used as a thermistor detecting temperature T of power semiconductor module 1.

Fourth Embodiment

Figure 8:
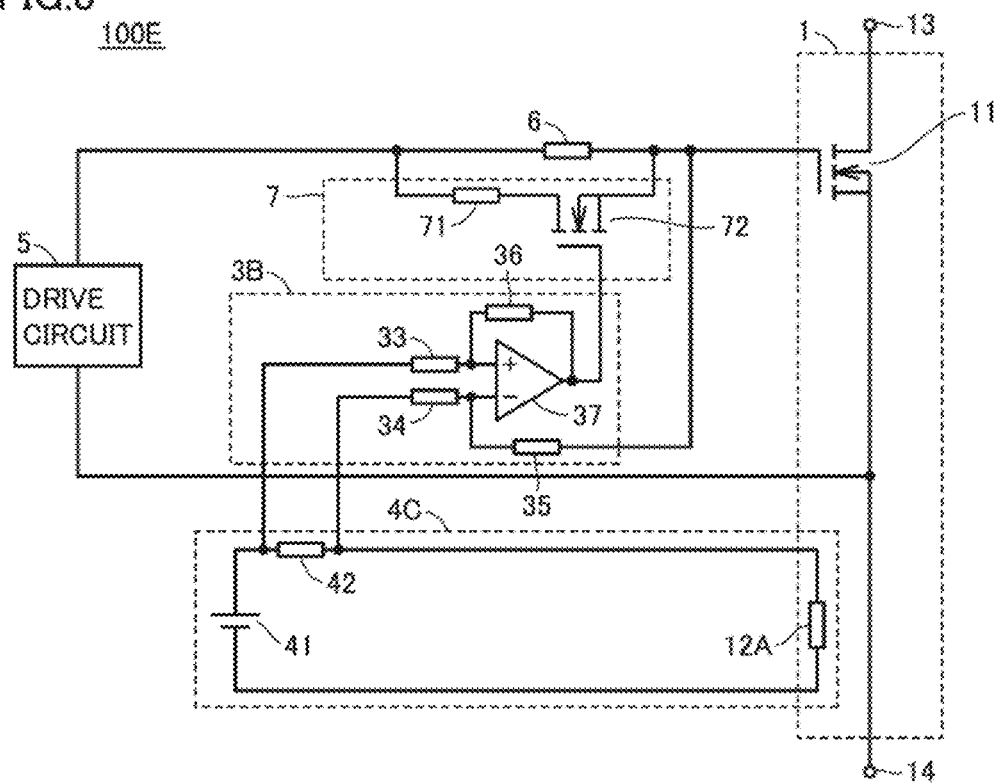
FIG. 8 is a circuit diagram illustrating a configuration of a semiconductor drive device according to a fourth embodiment.

FIG. 8 is a circuit diagram illustrating a configuration of a semiconductor drive device according to a fourth embodiment. With reference to FIG. 8, in the configuration of semiconductor drive device 100D in FIG. 6, a semiconductor drive device 100E includes control circuit 3B and a temperature detection circuit 4C instead of control circuit 3A and temperature detection circuit 4.

Control circuit 3B is as described in FIG. 5 of the second embodiment. In the fourth embodiment, the output terminal of operational amplifier 37 is connected to the gate of switching element 72 of resistance switching circuit 7.

Temperature detection circuit 4C includes thermistor 12A instead of the thermistor 12 in the configuration of temperature detection circuit 4B in FIG. 5. Thermistor 12A is a PTC thermistor as described in FIG. 4.

Other configurations of semiconductor drive device 166E are the same as those of semiconductor drive device 100D in FIG. 6.

In semiconductor drive device 100E, switching element 72 of resistance switching circuit 7 operates as a variable resistor according to the temperature detection result by thermistor 12A. Specifically, as the temperature of semiconductor switching element 11 increases, the resistance value of thermistor 12A increases, and the voltage across voltage dividing resistor 42 decreases. Then, the output of operational amplifier 37 decreases, and the resistance value of switching element 72 increases. Thus, the combined resistance value of gate resistor 6 and resistance element 71 increases, and the gate resistance of semiconductor switching element 11 increases. Accordingly, the fluctuation rate of the drain current and the drain voltage at the time of switching of semiconductor switching element 11 decreases, and gate oscillation is prevented.

On the other hand, as the temperature of semiconductor switching element 11 decreases, the resistance value of thermistor 12A decreases, and the voltage across voltage dividing resistor 42 increases. Then, the output of operational amplifier 37 increases, and the resistance value of switching element 72 decreases. Thus, the combined resistance value of gate resistor 6 and resistance element 71 also decreases, and the gate resistance of semiconductor switching element 11 decreases. Consequently, at a low temperature at which the gate oscillation is hardly generated, an increase in switching loss due to the decrease in the switching speed of semiconductor switching element 11 can be prevented.

In semiconductor drive device 100D of the third embodiment, as illustrated in FIG. 7, when temperature T of semiconductor switching element 11 exceeds set temperature T3, switching element 72 is turned off according to the output of comparator 31A, so that it can be said that gate resistance value Rg preventing the gate oscillation is excessive particularly at temperature T slightly higher than set temperature T3. In semiconductor drive device 100E of the fourth embodiment, the resistance value of switching element 72 continuously changes according to temperature T of semiconductor switching element 11, so that an appropriate gate resistance value can be obtained according to temperature E Consequently, the decrease in the switching speed of semiconductor switching element 11 can be prevented, and the switching loss can be prevented.

Although not particularly illustrated, also in the fourth embodiment, the PNP-type MOSFET or a bipolar transistor may be used for the switching element of resistance switching circuit 7. In addition, a PTC thermistor may be used as a thermistor detecting temperature of power semiconductor module 1.

Fifth Embodiment

In each of the above embodiments and modifications, capacitance switching circuit 2 (2A) and resistance switching circuit 7 may be configured by a plurality of stages. In this case, control circuit 3 (3A, 3B) is provided for each of the plurality of stages of capacitance switching circuits 2 (2A) or the plurality of stages of resistance switching circuits 7, and the reference voltage at reference voltage source 32 and the characteristic of the differential amplifier circuit including operational amplifier 37 are made different for each control circuit 3 (3A, 3B), whereby the capacitance value of capacitance switching circuit 2 (2A) or the resistance value of resistance switching circuit 7 can be continuously changed in multiple stages or in a wider range.

Figure 9:
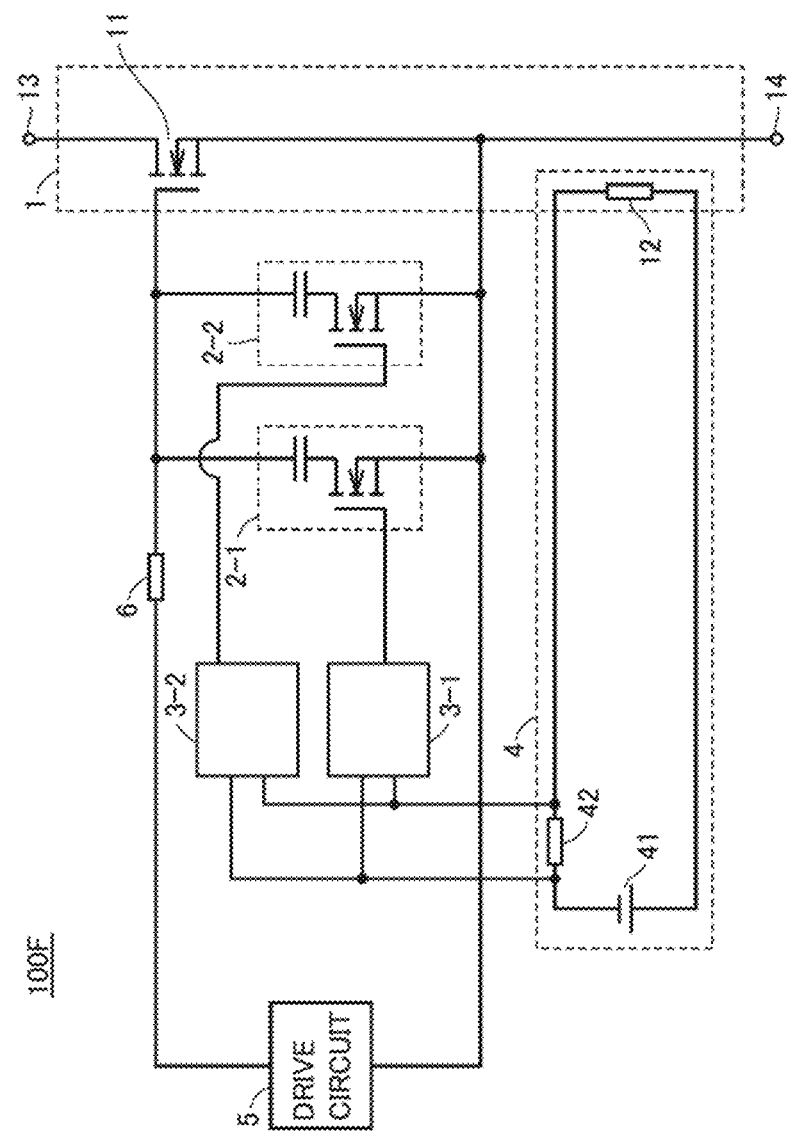
FIG. 9 is a configuration diagram in a case where a capacitance switching circuit and a control device are configured by a plurality of stages in the semiconductor drive device in the first embodiment.

As an example, FIG. 9 is a configuration diagram in the case where capacitance switching circuit 2 and control circuit 3 are configured of a plurality of stages in the semiconductor drive device of the first embodiment. The case where capacitance switching circuit 2 and control circuit 3 are configured of two stages will be exemplified in FIG. 9.

With reference to FIG. 9, in a semiconductor drive device 100F, capacitance switching circuit 2 is configured of capacitance switching circuits 2-1, 2-2 and control circuit 3 is configured of control circuits 3-1, 3-2 in semiconductor drive device 100 of the first embodiment in FIG. 1.

Capacitance switching circuits 2-1, 2-2 are connected in parallel between the gate and the source of semiconductor switching element 11. The configuration of each of capacitance switching circuits 2-1, 2-2 is the same as that of capacitance switching circuit 2 in FIG. 1. Control circuits 3-1, 3-2 are provided corresponding to capacitance switching circuits 2-1, 2-2, respectively. The configuration of each of control circuits 3-1, 3-2 is the same as that of control circuit 3 in FIG. 1. The input sides of control circuits 3-1, 3-2 are connected to both ends of voltage dividing resistor 42 of temperature detection circuit 4. That is, in this example, temperature detection circuit 4 is common to control circuits 3-1, 3-2.

In semiconductor drive device 100F, the reference voltage at reference voltage source 32 is made different for each of control circuits 3-1.3-2, so that the capacitance value connected between the gate and the source of semiconductor switching element 11 can be made multistage by capacitance switching circuits 2-1, 2-2. Consequently, the decrease in the switching speed of semiconductor switching element 11 can be prevented, and the switching, loss can be prevented.

Sixth Embodiment

In order to implement a power semiconductor device that performs switching operation with a large current, a plurality of power semiconductor modules are mounted and operated in parallel. In a semiconductor device including the plurality of power semiconductor modules connected in parallel, a configuration of a semiconductor drive device that drives each power semiconductor module is illustrated in a sixth embodiment.

Figure 10:
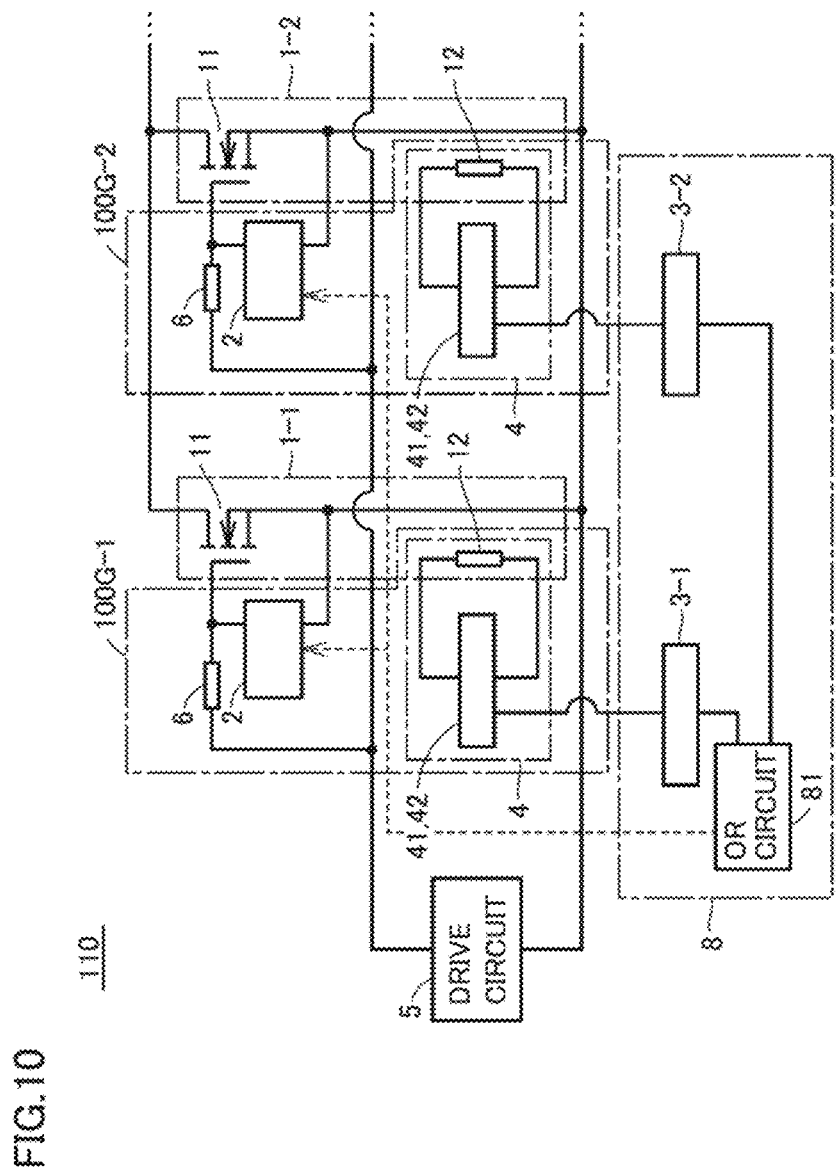
FIG. 10 is a circuit diagram illustrating a configuration of a semiconductor device according to a sixth embodiment.

FIG. 10 is a circuit diagram illustrating a configuration of a semiconductor device according to a sixth embodiment. With reference to FIG. 10, a semiconductor device 110 includes a plurality of power semiconductor modules 1-1, 1-2, . . . . The case where two power semiconductor modules 1-1, 1-2 are included will be representatively described below.

Semiconductor device 110 further includes semiconductor drive devices 100G-1, 100G-2, drive circuit 5, and a control circuit 8. Semiconductor drive devices 100G-1, 100G-2 are provided corresponding to power semiconductor modules 1-1, 1-2, respectively. Each of semiconductor drive devices 100G-1, 100G-2 includes capacitance switching circuit 2, temperature detection circuit 4, and gate resistor 6. Temperature detection circuit 4 includes a voltage source 41, voltage dividing resistor 42, and thermistor 12. Capacitance switching circuit 2, temperature detection circuit 4, and gate resistor 6 are as described in FIG. 1.

Control circuit 8 includes signal amplifier circuits 3-1, 3-2 and an OR circuit 81. Signal amplifier circuits 3-1, 3-2 are provided corresponding to semiconductor drive devices 100G-1, 100G-2, respectively. Each of signal amplifier circuits 3-1, 3-2 has the same configuration as the configuration of control circuit 3 in FIG. 1. That is, each of signal amplifier circuits 3-1, 3-2 includes comparator 31 and reference voltage source 32 (not illustrated). Then, signal amplifier circuit 3-1 outputs the comparison result between the voltage across voltage dividing resistor 42 in temperature detection circuit 4 of semiconductor drive device 100G-1 and the reference voltage at reference voltage source 32. Similarly, signal amplifier circuit 3-2 outputs the comparison result between the voltage across voltage dividing resistor 42 in semiconductor drive device 100G-2 and the reference voltage at reference voltage source 32.

OR circuit 81 performs a logical sum (OR) operation of the outputs from signal amplifier circuits 3-1, 3-2, and outputs the operation result to switching element 22 of capacitance switching circuit 2 of each of semiconductor drive devices 100G-1, 100G-2.

For each semiconductor drive devices 100G-1, 100G-2, when capacitance switching circuit 2 of semiconductor drive device 100G-1 is controlled based on the output result of signal amplifier circuit 3-1, and when capacitance switching circuit 2 of semiconductor drive device 100G-2 is controlled based on the output result of signal amplifier circuit 3-2, there is a possibility that capacitance switching circuit 2 may operate differently in semiconductor drive devices 100G-1, 100G-2 due to a temperature variation, a temperature detection error, or the like of power semiconductor modules 1-1, 1-2.

In semiconductor device 110, the control circuits of semiconductor drive devices 100G-1, 100G-2 are integrated, and when the voltage across voltage dividing resistor 42 in temperature detection circuit 4 exceeds the reference voltage at reference voltage source 32 in any one of semiconductor drive devices 100G-1, 100G-2, switching elements 22 of capacitance switching circuit 2 are turned on in all semiconductor drive devices 100G-1, 100G-2. Thus, in semiconductor drive devices 100G-1, 100G-2, the states of capacitance switching circuits 2 can be matched with each other, and generation of current imbalance between power semiconductor modules 1-1, 1-2 can be prevented.

In the first embodiment and the first and second modifications, set temperature T1 at which switching element 22 is switched on and off and capacitance value C0 of capacitor 21 are set from the gate oscillation conditions at the time of the gate-on, the gate-off, or the generation of the arm short circuit of semiconductor switching element 11. Also in the third embodiment, set temperature T3 at which switching element 72 is switched on and off and resistance value R1 of gate resistor 6 are set from the gate oscillation condition at the time of the gate-on, the gate-off, or the generation of the arm short circuit of semiconductor switching element 11. In the sixth embodiment, set temperatures T1, T3, capacitance value C0 of capacitor 21, and resistance value R1 of gate resistor 6 may be set from the oscillation condition between semiconductor switching elements 11 of power semiconductor modules 1-1, 1-2 connected in parallel Third Modification In the sixth embodiment, capacitance switching circuit 2 is provided for each semiconductor drive device 100G-1, 100G-2. However, capacitance switching circuit 2 may also be integrated in semiconductor drive devices 100G-1, 100G-2.

Figure 11:
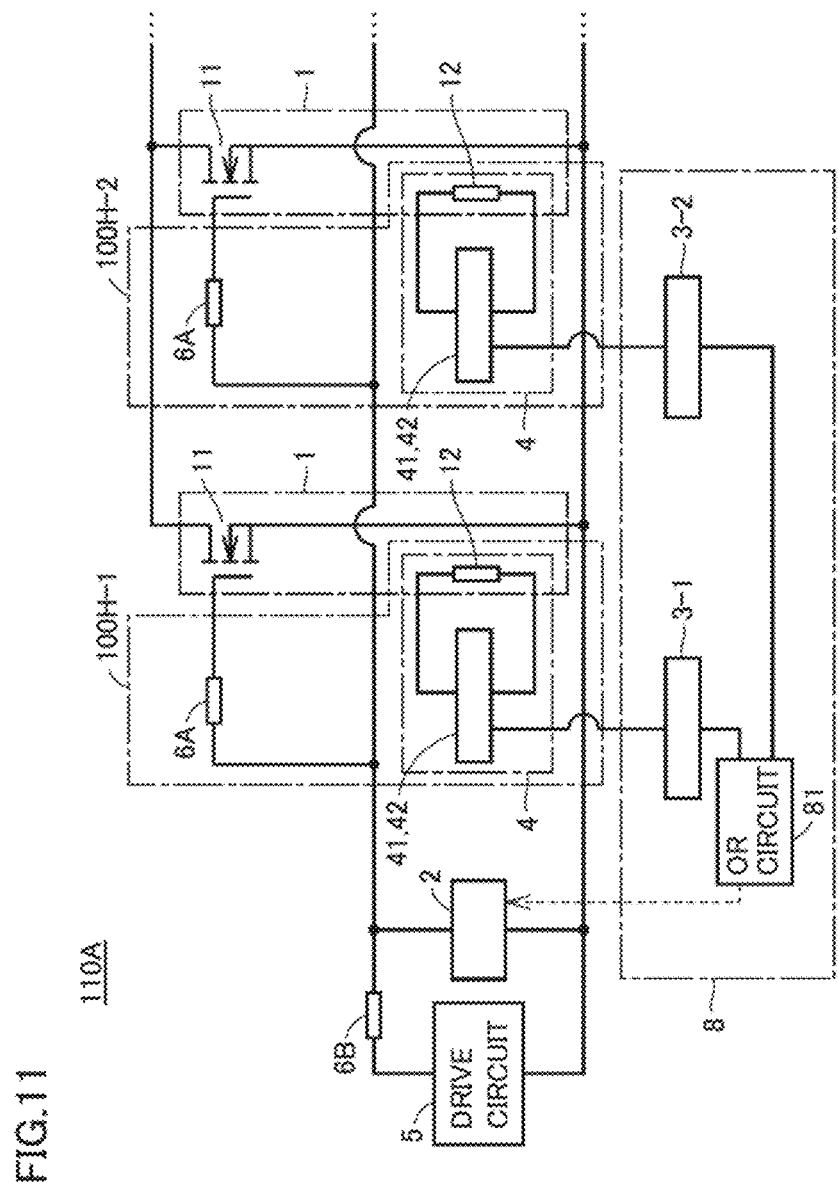
FIG. 11 is a circuit diagram illustrating a configuration of a semiconductor device according to a third modification.

FIG. 11 is a circuit diagram illustrating a configuration of a semiconductor device according to a third modification. Also FIG. 11, the case where two power semiconductor modules 1-1, 1-2 are included will be representatively described.

With reference to FIG. 11, a semiconductor device 110A includes power semiconductor modules 1-1, 1-2, semiconductor drive devices 100H-1, 100H-2, capacitance switching circuit 2, drive circuit 5, a gate resistor 63, and control circuit 8.

Each of semiconductor drive devices 100H-1, 100H-2 includes temperature detection circuit 4 and a gate resistor 6A. Temperature detection circuit 4 is as described in FIG. 1. Gate resistor 6A is connected between the gate of corresponding semiconductor switching element 11 and gate resistor 6B common to semiconductor drive devices 100H-1, 100H-2. The series resistance value of gate resistors 6A, 6B is the same as the resistance value of gate resistor 6 described in each of the above embodiments.

Capacitance switching circuit 2 is provided in common to semiconductor drive devices 100H-1, 100H-2, and is connected between the gate line connected to gate resistor 6A of each of semiconductor drive devices 100H-1, 100H-2 and the source of each of power semiconductor modules 1-1, 1-2. Capacitance switching circuit 2 includes a capacitor 21 and a switching element 22. The configuration of capacitance switching circuit 2 is as described in FIG. 1.

In semiconductor device 110A, not only the control circuits of semiconductor drive device 100H-1, 100H-2 but also capacitance switching circuit 2 is also integrated. Then, in any one of semiconductor drive devices 100H-1, 100H-2, when the voltage across voltage dividing resistor 42 in temperature detection circuit 4 exceeds the reference voltage at reference voltage source 32, switching element 22 of capacitance switching circuit 2 is turned on. As a result, in all semiconductor drive devices 100H-1, 100H-2, common capacitor 21 is connected between the gate and the source of semiconductor switching element 11.

According to the third modification, capacitance switching circuit 2 is also integrated for semiconductor drive devices 100H-1, 100H-2, the imbalance of the elements (capacitor 21 and switching element 22) constituting capacitance switching circuit 2 can also be prevented.

Semiconductor switching elements 11 of power semiconductor modules 1-1, 1-2 connected in parallel generally generate the same loss and have the same temperature. Accordingly, although not particularly illustrated, temperature detection circuits 4 may also be integrated. For example, in the configuration of semiconductor device 110A in FIG. 11, temperature detection circuit 4 may be provided only in one of semiconductor drive devices 100H-1, 100H-2, and capacitance switching circuit 2 common to semiconductor drive devices 100H-1, 100H-2 may be controlled based on the temperature detection result of temperature detection circuit 4.

Seventh Embodiment

In a seventh embodiment, semiconductor drive devices 100, 100A to 100E or semiconductor device 110, 110A according to the above-described embodiments and modifications are applied to a power conversion device. Although the present disclosure is not limited to a specific power conversion device, the case where semiconductor drive devices 100, 100A to 100F or semiconductor device 110, 110A are applied to a three-phase inverter will be described below as the seventh embodiment.

Figure 12:
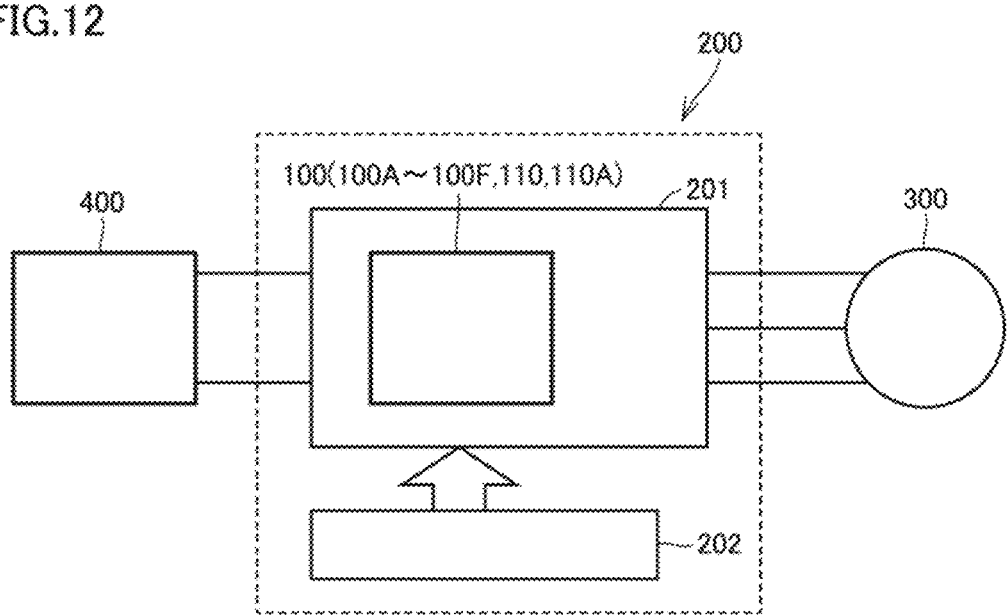
FIG. 12 is a block diagram illustrating a configuration of a power conversion system to which a power converter according to a seventh embodiment is applied.

FIG. 12 is a block diagram illustrating a configuration of a power conversion system to which a power converter according to a seventh embodiment is applied.

With reference to FIG. 12, the power conversion system includes a power conversion device 200, a load 300, and a power supply 400. Power supply 400 is a DC power supply, and supplies DC power to power conversion device 200. Power supply 400 can be configured of various components. For example, power supply 400 can be configured of a DC system, a solar cell, and a storage battery, or can be configured of a rectifier circuit connected to an AC system and an AC-DC converter. Power supply 400 may be constructed with a DC-DC converter that converts the DC power output from the DC system into predetermined power.

Power conversion device 200 is a three-phase inverter connected between power supply 400 and load 300, converts the DC power supplied from power supply 400 into AC power, and supplies the AC power to load 300. Power conversion device 200 includes a main conversion circuit 201 that converts the DC power into the AC power to output the AC power and a control device 202 that outputs a control signal controlling main conversion circuit 201 to main conversion circuit 201.

Load 300 is a three-phase motor driven by the AC power supplied from power conversion device 200. Load 300 is not limited to a specific application, but is a motor mounted on various electric appliances. For example, load 300 is used as a hybrid car, an electric car, a rail vehicle, an elevator, or a motor for an air conditioner.

Power conversion device 200 will be described in detail below. Main conversion circuit 201 is configured by including a semiconductor switching element and a diode (not illustrated), converts the DC power supplied from power supply 400 into the AC power by switching of the switching element, and supplies the AC power to load 300. Although there are various specific circuit configurations of main conversion circuit 201, main conversion circuit 201 of the seventh embodiment is a two-level three-phase full bridge circuit, and can be configured of six switching elements and six diodes connected in anti-parallel to the respective switching elements. Six switching elements are connected in series in every two switching elements to constitute upper and lower arms, and each upper and lower arm constitutes each phase (U-phase, V-phase, W-phase) of the full bridge circuit. An output terminal of each of the upper and lower arms, namely, three output terminals of main conversion circuit 201 are connected to load 300.

Each semiconductor switching element of main conversion circuit 201 corresponds to semiconductor switching element 11 described in each of the above-described embodiments and modifications. Main conversion circuit 201 further includes semiconductor drive devices 100, 100A to 100F or semiconductor device 110, 110A corresponding to any one of the above-described embodiments and modifications.

Main conversion circuit 201 includes drive circuit 5 (FIG. 1 and the like) that drives each semiconductor switching element. Drive circuit 5 generates the drive signal driving the semiconductor switching element of main conversion circuit 201, and supplies the drive signal to the control electrode of the semiconductor switching element of main conversion circuit 201. Specifically, the drive signal turning on the semiconductor switching element and the drive signal turning off the semiconductor switching element are output to the control electrode of each semiconductor switching element according to the control signal from control device 202 (described later). The drive signal is a voltage signal (ON signal) greater than or equal to a threshold voltage of the semiconductor switching element when the semiconductor switching element is maintained in an ON state, and the drive signal is a voltage signal (OFF signal) less than or equal to the threshold voltage of the semiconductor switching element when the semiconductor switching element is maintained in an OFF state.

Control device 202 controls the semiconductor switching elements of main conversion circuit 201 such that desired power is supplied to load 300. Specifically, control device 202 calculates time (ON time) during which each semiconductor switching element of main conversion circuit 201 is to be turned on is calculated based on the power to be supplied to load 300. For example, control device 202 can control main conversion circuit 201 by pulse width modulation (PWM) control that modulates the ON time of the semiconductor switching element according to the voltage to be output. Control device 202 outputs a control command (control signal) to drive circuit 5 included in main conversion circuit 201 such that the ON signal is output to the semiconductor switching element to be turned on at each time point, and such that the OFF signal is output to the semiconductor switching element to be turned off at each time point. Drive circuit 5 outputs the ON signal or the OFF signal as the drive signal to the control electrode of each semiconductor switching element according to the control signal.

In the power conversion device of the seventh embodiment, main conversion circuit 201 includes semiconductor drive devices 100, 100A to 100F or semiconductor device 110, 110A in any one of the above-described embodiments and modifications, so that the same effects as those of the above-described embodiments and modifications can be implemented.

Although the example in which the present disclosure is applied to the two-level three-phase inverter is described, the present disclosure is not limited thereto, but can be applied to various power conversion devices. In the seventh embodiment, the two-level power conversion device is used. However, a three-level or multi-level power conversion device may be used, or the present disclosure may be applied to a single-phase inverter when the power is supplied to a single-phase load. In addition, the present disclosure can also be applied to a DC/DC converter, an AC/DC converter, or the like when the power is supplied to a DC load or the like.

In addition, the power conversion device to which the present disclosure is applied is not limited to the case where the load described above is the electric motor, but can also be used as, for example, a power supply device for an electric discharge machine, a laser beam machine, an induction heating cooker, or a non-contact power feeding system, and can also be used as a power conditioner for a solar power generation system, a power storage system, or the like.

In each of the above embodiments and modifications, semiconductor switching element 11 is configured of the NPN-type MOSFET. However, semiconductor switching element 11 may be configured of an NPN-type bipolar transistor (IGBT (Insulated Gate Bipolar Transistor) or the like), the PNP-type MOSFET, or a bipolar transistor. When the PNP type semiconductor switching element is used, the control circuit using comparators 31, 31A may be used by inverting polarity, and the control circuit using operational amplifier 37 may be used by using a PTC thermistor instead of the NTC thermistor.

Furthermore, in the above description, semiconductor switching element 11 is configured of the wide band gap semiconductor. However, the application range of the present disclosure is not limited to that for driving the semiconductor switching element configured of the wide band gap semiconductor, hut includes that for driving a conventional silicon-based semiconductor switching element.

In each of the above embodiments and modifications, the capacitance value between the gate and the source of semiconductor switching element 11 or the resistance value connected to the gate is changed using the temperature dependency of thermistors 12, 12A. However, a diode or a thermocouple having a temperature characteristic of an on-voltage may be used instead of the thermistor.

In addition, comparators 31, 31A or operational amplifier 37 used in each of the above embodiments and modifications may be configured by digital control using an integrated circuit (IC) or the like.

The embodiments disclosed herein are also planned to be implemented in appropriate combination within a technical range not contradictory. It should be considered that the disclosed embodiments are an example in all respects and not restrictive. The technical scope of the present disclosure is defined by not the description of the embodiments, but the claims, and it is intended that all changes within the meaning and scope of the claims are included in the present invention.

REFERENCE SIGNS LIST 1, 1-1, 1-2: power semiconductor module, 2, 2A: capacitance switching circuit, 3, 3A, 3B, 8: control circuit, 3-1, 3-2: signal amplifier circuit, 4, 4A to 4C: temperature detection circuit, 5: drive circuit, 6, 6A, 6B: gate resistor, 7: resistance switching circuit, 11: semiconductor switching element, 12, 12A: thermistor, 13: drain terminal, 14: source terminal, 21: capacitor, 22, 23, 72: switching element, 31, 31A: comparator, 32: reference voltage source, 33 to 36, 71: resistance element, 37: operational amplifier, 41: voltage source, 42: voltage dividing resistor, 81: OR circuit, 100, 100A to 100H: semiconductor drive device, 110, 110A: semiconductor device, 200: power conversion device, 201: main conversion circuit, 202: control device, 300: load, 400: power supply

The invention claimed is:

1. A semiconductor drive device comprising:
a drive circuit to drive a semiconductor switching element;
a passive element connected to a gate of the semiconductor switching element to prevent a gate current of the semiconductor switching element;
a switching element connected in series to the passive element;
a control circuit to control the switching element; and
a temperature detection circuit to detect a temperature of the semiconductor switching element,
wherein the control circuit controls the switching element such that when the temperature detected by the temperature detection circuit is high, the gate current is prevented more than when the temperature is low.

2. The semiconductor drive device according to claim 1, wherein the passive element is a capacitor connected between the gate and a source of the semiconductor switching element,
the switching element is connected in series to the passive element between the gate and the source of the semiconductor switching element, and
the control circuit controls the switching element such that when the temperature detected by the temperature detection circuit is high, resistance of the switching element becomes lower than when the temperature is low.

3. The semiconductor drive device according to claim 1, further comprising a gate resistor connected between the gate of the semiconductor switching element and the drive circuit,
the passive element is a resistance element,
a circuit including the resistance element and the switching element is connected in parallel to the gate resistor, and
the control circuit controls the switching element such that when the temperature detected by the temperature detection circuit is high, resistance of the switching element becomes higher than when the temperature is low.

4. The semiconductor drive device according to claim 1, wherein the control circuit includes a signal amplifier circuit that amplifies an output of the temperature detection circuit.

5. The semiconductor drive device according to claim 4, wherein the temperature detection circuit includes:
a thermistor;
a voltage dividing resistor connected in series to the thermistor; and
a voltage source that applies a constant voltage to a circuit including the thermistor and the voltage dividing resistor, and
the signal amplifier circuit includes:
a reference voltage source that outputs a reference voltage; and
a comparator that outputs a signal according to a comparison result between a voltage across the voltage dividing resistor and the reference voltage to a gate of the switching element.

6. The semiconductor drive device according to claim 4, wherein the temperature detection circuit includes:
a thermistor;
a voltage dividing resistor connected in series to the thermistor; and
a voltage source that applies a constant voltage to a circuit including the thermistor and the voltage dividing resistor,
the signal amplifier circuit includes a differential amplifier circuit that outputs a signal corresponding to a voltage across the voltage dividing resistor to a gate of the switching element, and
the switching element is configured such that a resistance value changes according to magnitude of the signal from the differential amplifier circuit.

7. A power conversion device comprising:
a main conversion circuit including a semiconductor switching element and the semiconductor drive device according to claim 1; and
a control device to generate a control signal controlling the main conversion circuit and output to the main conversion circuit.

8. The semiconductor drive device according to claim 2, wherein the control circuit includes a signal amplifier circuit that amplifies an output of the temperature detection circuit.

9. The semiconductor drive device according to claim 3, wherein the control circuit includes a signal amplifier circuit that amplifies an output of the temperature detection circuit.

10. A power conversion device comprising:
a main conversion circuit including a semiconductor switching element and the semiconductor drive device according to claim 2; and
a control device to generate a control signal controlling the main conversion circuit and output to the main conversion circuit.

11. A power conversion device comprising:
a main conversion circuit including a semiconductor switching element and the semiconductor drive device according to claim 3; and
a control device to generate a control signal controlling the main conversion circuit and output to the main conversion circuit.

12. A power conversion device comprising:
a main conversion circuit including a semiconductor switching element and the semiconductor drive device according to claim 4; and
a control device to generate a control signal controlling the main conversion circuit and output to the main conversion circuit.

13. A power conversion device comprising:
a main conversion circuit including a semiconductor switching element and the semiconductor drive device according to claim 5; and
a control device to generate a control signal controlling the main conversion circuit and output to the main conversion circuit.

14. A power conversion device comprising:
a main conversion circuit including a semiconductor switching element and the semiconductor drive device according to claim 6; and
a control device to generate a control signal controlling the main conversion circuit and output to the main conversion circuit.

15. A power conversion device comprising:
a main conversion circuit including a semiconductor switching element and the semiconductor drive device according to claim 8; and
a control device to generate a control signal controlling the main conversion circuit and output to the main conversion circuit.

16. A power conversion device comprising:
a main conversion circuit including a semiconductor switching element and the semiconductor drive device according to claim 9; and
a control device to generate a control signal controlling the main conversion circuit and output to the main conversion circuit.

17. A semiconductor device comprising:
a plurality of semiconductor switching elements connected in parallel to each other;
a plurality of semiconductor drive devices provided corresponding to the plurality of semiconductor switching elements;
a drive circuit to drive the plurality of semiconductor switching elements, each of the plurality of semiconductor drive devices including
a passive element connected to a gate of the corresponding semiconductor switching element to prevent a gate current of the corresponding semiconductor switching element,
a switching element connected in series to the passive element, and
a temperature detection circuit to detect a temperature of the corresponding semiconductor switching element; and
a control circuit to control the switching element in each of the plurality of semiconductor drive devices, wherein
the control circuit controls the switching element in each of the plurality of semiconductor drive devices such that when the temperature detected by the temperature detection circuit is high, the gate current is prevented more than when the temperature is low in each of the plurality of semiconductor drive devices.

18. A power conversion device comprising:
a main conversion circuit including the semiconductor device according to claim 17; and
a control device to generate a control signal controlling the main conversion circuit and output to the main conversion circuit.

19. A semiconductor device comprising:
a plurality of semiconductor switching elements connected in parallel to each other;
a plurality of temperature detection circuits provided corresponding to the plurality of semiconductor switching elements, each of the plurality of temperature detection circuits detecting a temperature of the corresponding semiconductor switching element;
a drive circuit to drive the plurality of semiconductor switching elements;
a passive element connected to a gate of each of the plurality of semiconductor switching elements to prevent a gate current of each of the plurality of semiconductor switching elements;
a switching element connected in series to the passive element; and
a control circuit to control the switching element,
wherein the control circuit controls the switching element in each of the plurality of semiconductor switching elements such that when a temperature detected by the corresponding temperature detection circuit is high, the gate current is prevented more than when the temperature is low.

20. A power conversion device comprising:
a main conversion circuit including the semiconductor device according to claim 19; and
a control device to generate a control signal controlling the main conversion circuit and output to the main conversion circuit.

* * * * *